United States Patent
Yuki et al.

(10) Patent No.: US 7,038,372 B2
(45) Date of Patent: May 2, 2006

(54) ORGANIC EL ELEMENT AND METHOD OF PRODUCING THE SAME

(75) Inventors: Toshinao Yuki, Yamagata (JP); Kunihiko Shirahata, Yamagata (JP); Akihiko Numazawa, Yamagata (JP); Shinsuke Tanaka, Yamagata (JP); Tsuyoshi Naijo, Yamagata (JP); Masato Nakamura, Yamagata (JP); Yusuke Nakajima, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 0 days.

(21) Appl. No.: 10/864,868

(22) Filed: Jun. 10, 2004

(65) Prior Publication Data
US 2005/0012451 A1    Jan. 20, 2005

(30) Foreign Application Priority Data
Jun. 12, 2003   (JP)   ............................ P2003-167871

(51) Int. Cl.
*H05B 33/10*   (2006.01)
(52) U.S. Cl. ........................................ 313/504; 313/506
(58) Field of Classification Search ................. 313/504
See application file for complete search history.

(56) References Cited

U.S. PATENT DOCUMENTS

| | | | | |
|---|---|---|---|---|
| 5,281,489 A | * | 1/1994 | Mori et al. ................. | 428/690 |
| 6,337,404 B1 | * | 1/2002 | Han et al. ................... | 548/440 |
| 6,342,637 B1 | * | 1/2002 | Han et al. ................... | 564/434 |
| 6,366,017 B1 | * | 4/2002 | Antoniadis et al. ......... | 313/506 |
| 6,392,250 B1 | * | 5/2002 | Aziz et al. ................... | 257/40 |
| 6,392,339 B1 | * | 5/2002 | Aziz et al. ................... | 313/504 |
| 6,552,488 B1 | * | 4/2003 | Roitman et al. ............ | 313/512 |
| 6,661,023 B1 | * | 12/2003 | Hoag et al. ................... | 257/40 |

FOREIGN PATENT DOCUMENTS

| | | |
|---|---|---|
| JP | 2000-91067 A | 3/2000 |
| JP | 2001-68272 A | 3/2001 |

* cited by examiner

*Primary Examiner*—Joseph Williams
*Assistant Examiner*—Dalei Dong
(74) *Attorney, Agent, or Firm*—Sughrue Mion, PLLC

(57) ABSTRACT

A first electrode is formed above a substrate, organic material layers are stacked above the first electrode, and a second electrode is formed above the organic material layers. Among the organic material layers, at least two organic material layers having interfaces which electrons or holes traverse are formed by layers which are heat-treated at a temperature that is equal to or higher than the glass transition points of materials respectively constituting the organic material layers and equal to or lower than the melting points of the materials.

4 Claims, 2 Drawing Sheets

ORGANIC EL ELEMENT AND METHOD OF PRODUCING THE SAME

BACKGROUND OF THE INVENTION

1. Field of the Invention

The present invention relates to an organic EL (Electroluminescence) element, and also to a method of producing it.

2. Description of the Related Art

An organic EL element is a surface emitting device configured so that electrodes of a unit area are opposingly placed above a substrate, one of the electrodes is used as an anode to which a positive voltage is to be applied, the other electrode is used as a cathode to which a negative voltage is to be applied, and organic material layers including a luminescent layer are interposed between the electrodes. When a voltage is applied between the electrodes, electrons are injected from the cathode into the luminescent layer, holes are injected from the anode into the luminescent layer, and electron-hole recombination occurs in the luminescent layer, thereby causing luminescence. When a plurality of such organic EL elements are formed in a matrix as unit surface emitting elements above a substrate and then driven in the dot-matrix system, it is possible to form a self-luminescent flat panel display which can display a high-definition image.

Such an organic EL element is characterized in that the luminescent layer is formed by an organic material. In order to inject electrons or holes and improve the efficiency of electron-hole recombination, usually, a hole injecting layer, a hole transporting layer, an electron injecting layer, and an electron transporting layer are selectively placed between the luminescent layer and the electrodes, and each of the layers is formed by a thin layer of about 30 to 200 nm. As described above, organic material layers of an organic EL element are configured by a stack of thin films. When a foreign matter enters the organic material layers during a process of growing the layers, or when the electrodes are rugged, therefore, local ungrown portions are easily produced during a growing step. As a result, a structure is formed in which such ungrown portions tend to cause a partial short circuit between the electrodes, abnormal emission and dark spot formation due to occurrence of a leakage current, and the like.

As a countermeasure for the above, a technique is disclosed in, for example, JP-A-2001-68272 and JP-A-2000-91067. In the technique, a hole injecting and transporting material is heat-treated above an anode (hole injecting electrode) at a temperature that is equal to or higher than the glass transition temperature of the material, and above-mentioned ungrown portions are covered by using a phenomenon in which the heat-fused material merges with neighboring materials.

In the conventional technique, one layer which is formed above an anode and made of a hole injecting and transporting material is heat-treated to cover local ungrown portions. Usually, a foreign matter such as dust, or ruggedness which causes the above-mentioned troubles is considerably large as compared with the film thickness of each organic material layer. Even when ungrown portions of one layer to be heat-treated may be covered by a heating process of the layer, therefore, there is the possibility that ungrown portions may be formed in another layer which is stacked on the foreign matter or the ruggedness. In the case where ungrown portions are formed in another layer, there arise the problems of such abnormal emission and dark spot formation due to occurrence of a leakage current, in the same manner as the case which has been described above.

In plural organic material layers to be stacked, different materials are used depending on the functions of the layers. However, these materials do not always have a satisfactory junction property of an interface. Depending on the selected materials, therefore, charges cannot smoothly traverse an interface, and excellent voltage-current characteristics cannot be obtained.

By contrast, in the case where an organic material layer formed above an electrode is heat-treated, slight denaturation occurs in the surface state. When another organic material layer is stacked above the layer, therefore, there is the possibility that the junction property of the interface between the stacked organic material layers is impaired and traversing of electrons or holes through the interface is hindered. In this case also, there is the possibility that voltage-current characteristics of a resulting organic EL element are adversely affected and luminance characteristics are degraded.

SUMMARY OF THE INVENTION

An object of the invention is to cope with the above problems. Namely, objects of the invention are such as that, when an organic EL element is formed by stacking a plurality of organic material layers, local ungrown portions are not formed in the stacked layers, and a partial short circuit between electrodes, abnormal emission and dark spot formation due to occurrence of a leakage current, and the like are prevented from occurring, and that excellent traversing of charges through an interface between the stacked organic material layers is enabled and satisfactory luminance characteristics of the organic EL element are ensured.

In order to attain the objects, the organic EL element and the method of producing the organic EL element according to the invention comprise at least the following configurations.

An organic EL element in which a first electrode is formed above a substrate, a plurality of organic material layers including at least one of luminescent layers are stacked above the first electrode, and a second electrode are formed above the organic material layers, wherein at least two of the organic material layers are heat-treated at a temperature that is equal to or higher than glass transition points of materials respectively constituting the organic material layers, and equal to or lower than melting points of the materials, the at least two organic material layers having an interface which electrons or holes traverse.

A method of producing an organic EL element in which a first electrode is formed above a substrate, a plurality of organic material layers including at least one of luminescent layers are stacked above the first electrode, and a second electrode are formed above the organic material layers, wherein the method comprises the steps of: growing at least two of the organic material layers, the at least two organic material layers having an interface which electrons or holes traverse; and heat-treating the grown organic material layers at a temperature that is equal to or higher than glass transition points of materials respectively constituting the organic material layers, and equal to or lower than melting points of the materials.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of the present invention with reference to the accompanying drawings.

Figure 1:
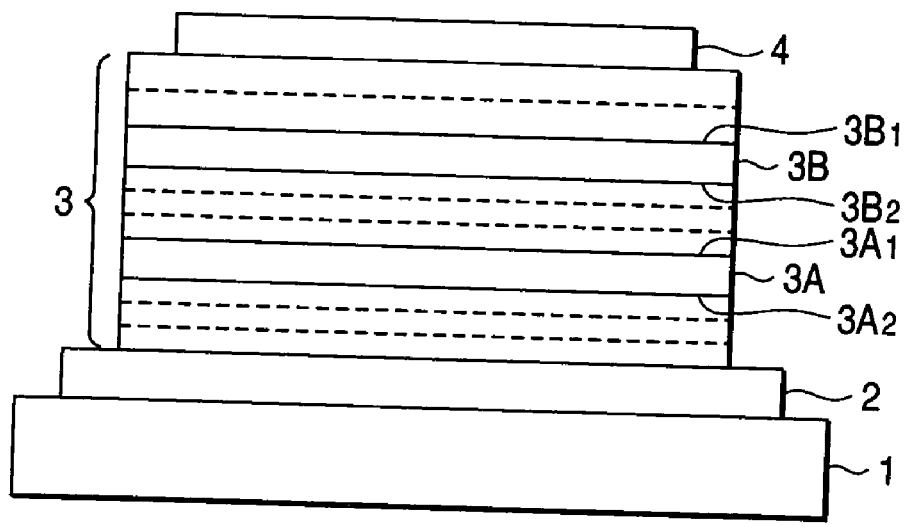
FIG. 1 is a diagram illustrating an organic EL element of an embodiment of the invention.
Figure 2:
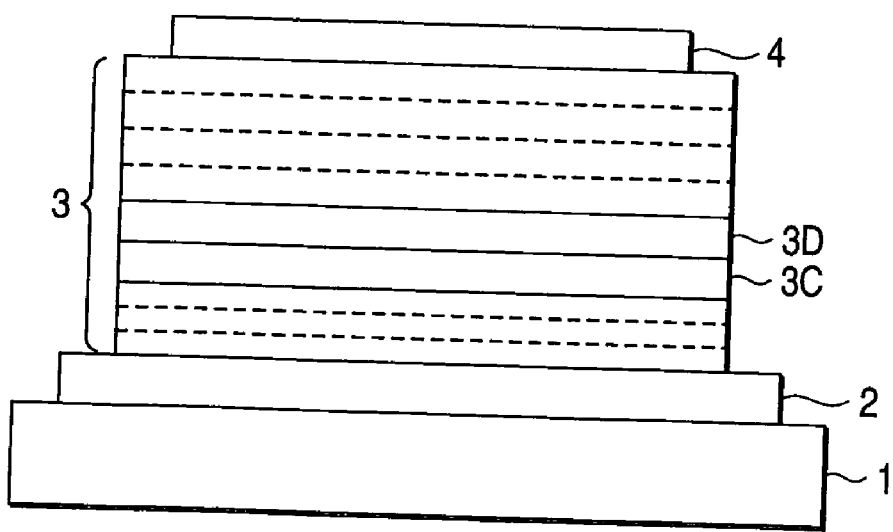
FIG. 2 is a diagram illustrating an organic EL element of the embodiment of the invention.

Hereinafter, an embodiment of the invention will be described with reference to the accompanying drawings. FIGS. 1 and 2 are diagrams illustrating an organic EL element of an embodiment of the invention. The organic EL element has a basic configuration in which a first electrode 2 is formed above a substrate 1, organic material layers 3 are stacked above the first electrode 2, and a second electrode 4 is formed above the organic material layers 3.

As a first feature, as shown in FIG. 1, at least two organic material layers 3A, 3B of the organic material layers 3 have interfaces $3A_1$, $3A_2$, $3B_1$, $3B_2$ which electrons or holes traverse. The two organic material layers 3A, 3B are formed by layers which are heat-treated at a temperature that is equal to or higher than the glass transition points of materials respectively constituting the organic material layers and equal to or lower than the melting points of the materials.

According to the configuration, even when a foreign matter such as dust or ruggedness exists above the first electrode 2 or a certain one of the organic material layers, the at least two organic material layers 3A, 3B which are stacked on the electrode or the layer are heat-treated. Therefore, the ratio at which local ungrown portions are formed in each of the layers is remarkably lowered as compared with the case where a heating process is conducted above a single layer, with the result that problems such as abnormal emission and dark spot formation due to occurrence of a leakage current in an organic EL element can be efficiently prevented from arising. Even in the case where a foreign matter which is large in relation to the thickness of each layer, since plural layers are heat-treated to be fused, the foreign matter can be enfolded by a thickness which is two or more times larger than the conventional case where a heating process is conducted on only a single layer, and it is possible to surely avoid ungrown portions. Therefore, the product yield can be improved, and the production cost can be lowered.

Since an organic material layer grown on the surface of another organic material layer is heat-treated, the organic material layer grown on the surface of the other organic material layer is fused and conforms to the surface, so that the junction property of the interface between the layers can be made superior than that in the case where such layers are stacked only by means of film growth. Therefore, charges can traverse the interface smoothly and uniformly, satisfactory luminance characteristics can be ensured under preset voltage-current characteristics, and the thermal stability can be improved as compared with the case where such layers are stacked only by means of film growth due to vapor deposition or the like.

As a second feature, in addition to the above-described feature, the embodiment is characterized in that the glass transition point of the material constituting an arbitrary one of the organic material layers 3 or the organic material layer 3B is lower than that of the material constituting the organic material layer 3A which is above the side of the substrate 1 with respect to the organic material layer 3B. Namely, in an organic EL element having a structure of supporting substrate/first electrode 1/organic material layer (l)/ . . . / organic material layer (m)/ . . . /organic material layer (n)/ . . . / second electrode 4, materials are employed so that the glass transition point Tgm of the material constituting the organic material layer (m) is larger than the glass transition point Tgn of the material constituting the organic material layer (n) or Tgm>Tgn, and each of the layers is heat-treated at a temperature in the vicinity of the glass transition temperature of the layer.

According to the configuration, when the organic material layer 3B formed above the organic material layer 3A which has been once heat-treated is to be heat-treated, the heating process is conducted at a temperature in the vicinity of the glass transition point of the material constituting the layer, thereby allowing the heating process of fusing the organic material layer 3B to be conducted without melting the organic material layer 3A which is placed below the layer 3B. Therefore, each layer can be fused without changing the physical properties of an organic material layer which is formed below the layer, whereby ungrown portions can be prevented from being formed.

As a third feature, in addition to the above-described features, the embodiment is characterized in that the organic material layers 3 are stacked above the substrate 3 in an order of descending glass transition points of the materials respectively constituting the organic material layers. According to the configuration, when one of the organic material layers 3 is to be heat-treated, the temperature of the heating process is set to the vicinity of the glass transition point of the material constituting the layer, thereby allowing the heating process to be conducted above the layer without adversely affecting a layer(s) placed below the layer.

As a fourth feature, in addition to the above-described features, the embodiment is characterized in that each of at least two organic material layers 3C, 3D which are adjacently stacked is heat-treated at a temperature that is equal to or higher than the glass transition point of a material constituting the organic material layer 3C or 3D, and equal to or lower than melting point of the material (see FIG. 2). According to the configuration, a heating process is applied also to the organic material layer which is stacked above the organic material layer that has been once heat-treated. Even when the surface of the organic material layer that has been once heat-treated denatures, therefore, the organic material layer which is stacked on the surface is fused and conforms to the surface, so that the junction property of the interface between the layers can be made superior. As a result, charges can traverse the interface smoothly and uniformly, satisfactory luminance characteristics can be ensured under preset voltage-current characteristics, and the thermal stability can be improved.

Hereinafter, each of the components of the organic EL element having these features will be described.

a. Substrate

In accordance with the shape of a display panel which is to be formed by organic EL elements, the substrate 1 can have any one of shapes such as a flat plate-like shape, a film-like shape, and a spherical shape. The substrate can be made of a material such as glass, plastic, quartz, or a metal. In the case where a bottom emission display panel in which light is emitted from the side of the substrate is to be formed, a transparent material is used. By contrast, in the case where a top emission display panel in which light is emitted from the side opposite to the substrate is to be formed, a material having transparency of any degree can be used. Preferred examples of the material in the case of a bottom emission display panel are transparent glass and transparent plastic.

b. Electrodes

Either of the first electrode 2 formed above the substrate 1, and the second electrode 4 formed above the organic material layers 3 can be used as an anode or a cathode. The anode is made of a material having a work function which is higher than that of the cathode, or configured by a film of a metal such as chromium (Cr), molybdenum (Mo), nickel (Ni), or platinum (Pt), or a film of a transparent conductor such as Indium oxide ($In_2O_3$), ITO, or IZO. By contrast, the cathode is made of a material having a work function which is lower than that of the anode, or configured by a film of a metal such as aluminum (Al) or magnesium (Mg), an amorphous semiconductor such as doped polyaniline or doped polyphenylene-vinylene, or an oxide such as $Cr_2O_3$, NiO, or $Mn_2O_5$. Usually, an electrode through which light is to be emitted is formed as a transparent electrode. Alternatively, it is possible to employ a configuration in which both of the first electrode 2 and the second electrode 4 is made of a transparent material and a reflection film is disposed above the side opposite to the light emission side, that in which a reflection film is disposed above the side of the first electrode 2 to form a top emission element, or that in which a reflection film is disposed above the side of the second electrode 4 to form a bottom emission element.

As an electrode structure for forming a plurality of organic EL elements in a dot-matrix above the substrate 1, either of the following systems can be employed: the passive driving system in which plural second electrodes 4 are formed so as to be orthogonal to plural first electrodes 2 formed in a stripe manner, organic EL elements are formed in respective intersection surfaces of the first electrodes 2 and the second electrodes 4, and the organic EL elements are driven by applying a voltage to selected first and second electrodes; and the active driving system in which unit electrodes (pixel electrodes) for respective display units are formed as first electrodes 2 above the substrate 1, a common electrode covering the unit electrodes is formed as a second electrode 4, and the display units are driven by respective active elements such as thin film transistors. The first electrodes 2 can be formed by film growth such as vapor deposition or sputtering, and patterning by masking, photolithography, and the like. The second electrodes 4 can be formed by film growth such as vapor deposition or sputtering, and patterning by masking, electrode diaphragms, and the like.

c. Organic Material Layers

Usually, the organic material layers 3 are formed by an organic luminescent function layer consisting of a hole transporting layer, a luminescent layer, and an electron transporting layer. In the invention, the luminescent layer may be formed in single layer. The luminescent layer may be formed in a plural layers. Alternatively, luminescent layers, hole transporting layers, and electron transporting layers may be stacked in place of a single-layer stack. One or both of the hole transporting layer and the electron transporting layer may be omitted. Organic function layers such as a hole transporting layer and an electron transporting layer may be inserted in accordance with the usage of the display panel.

The stack of the organic material layers can be formed by: a wet process including a coating method such as the spin coating method, or the dipping method, and a printing method such as the ink jet method, or the screen printing method; or a dry process such as the vapor deposition method or the laser transfer method.

When the first electrode 2 which is above the side of the substrate 1 is set as an anode, the second electrode 4 is set as a cathode, and the organic material layers 3 are stacked in the order of ascending ionization potentials of the materials constituting the layers, charges can be smoothly transported among the layers, and the life of the element can be prolonged.

Although specific examples of hole injecting and transporting materials forming the hole injecting layer and the hole transporting layer, a luminous material forming the luminescent layers, and electron injecting and transporting materials forming the electron injecting layer and the electron transporting layer are shown below, embodiments of the invention are not restricted to these materials, and other materials can be adequately selected in accordance with the function.

Hole injecting and transporting material: In a material which is used for constituting the hole injecting layer, it is important that the ionization potential is low (5.0 eV or lower). The hole transporting layer is requested only to have a high hole mobility. As the material of the hole transporting layer, an arbitrary one of conventionally known compounds can be selected.

Specific examples of these materials are: porphyrin compounds such as copper phthalocyannine (Cu-Pc); starburst amines such as m-MTDATA; aromatic tertiary amines such as benzidine polymer, 4,4'-bis[N-(1-naphtyl)-N-phenylamino]-biphenyl (NPB), and N-phenyl-p-phenylenediamine (PPD); stilbene compounds such as 4-(di-p-tolylamino)-4'-[4-(di-p-tolylamino) styryl]stilbenzene; and organic materials such as triazole derivatives, and styrylamine compounds. Also useful is a polymer dispersed material in which a low-molecular-weight hole injecting and transporting organic material is dispersed in a polymer such as polycarbonate.

Luminous material: Specific examples of the luminescent material are: aromatic dimethylidine compounds such as 4,4'-bis(2,2'-diphenylvinyl)-biphenyl (DPVBi); styrylbenzene compounds such as 1,4-bis(2-methylsthyryl)benzene; triazole derivatives such as 3-(4-biphenyl)-4-phenyl-5-t-buthylphenyl-1,2,4-triazole (TAZ); fluorescent organic materials such as anthraquinone derivatives, and fluorenone derivatives; fluorescent organometallic compounds such as (8-hydroxyquinolinate)aluminum complexes ($Alq_3$); polymer materials such as polyparaphenylene vinylenes (PPV), polyolefins, and polyvinyl carbazoles (PVK); and organic materials such as platinum complexes and iridium complexes in which phosphorescence from a triplet exciton is used for luminescence. The luminescent material may be configured by only such a luminescent material, or alternatively contain a hole transporting material, an electron transporting material, an additive (doner, acceptor, or the like), a luminescent dopant, or the like. These materials may be dispersed in a polymer material or an inorganic material.

Electron injecting and transporting material: The electron injecting layer is interposed between an electron transporting layer and a cathode. A material having a large electron affinity which promotes electron injection from the cathode is employed as the electron injecting layer. The electron transporting layer is requested to have only a function of transporting electrons injected from the cathode, to the luminescent layers. As the material of the electron transporting layer, an arbitrary one of conventionally known compounds can be selected.

Specific examples of such materials are: silacyclopentadiene (silole) derivatives such as PyPySPyPy; organic materials such as nitro-substituted fluorenone derivatives, and anthraquinodimethane derivatives; metal complexes of 8-quinolinol derivatives such as tris(8-hydroxyquinolinate) aluminum ($Alq_3$); triazole compounds such as metalphthalocyanine, and 3-(4-biphenyl)-5-(4-t-butylphenyl)-4-phenyl-1,2,4-triazole (TAZ); oxadiazole compounds such as 2-(4-biphenylyl)-5-(4-t-butyl)-1,3,4-oxadiazole (PBD); and metal oxides such as $LiO_2$.

Figure 3A:
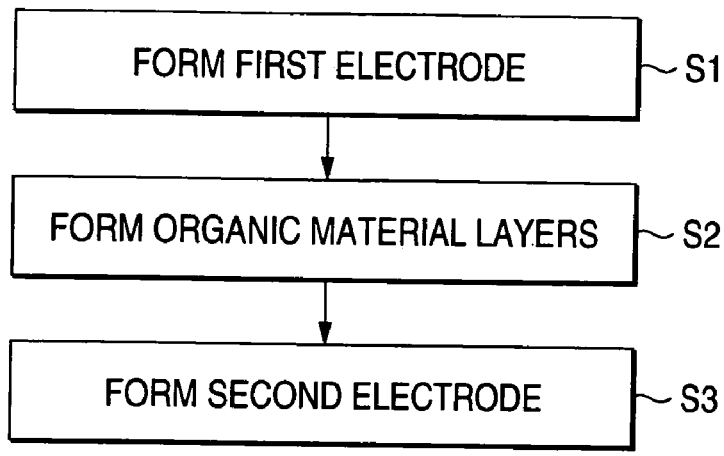
FIGS. 3A and 3B are views illustrating a method of producing the organic EL element of the embodiment of the invention.
Figure 3B:
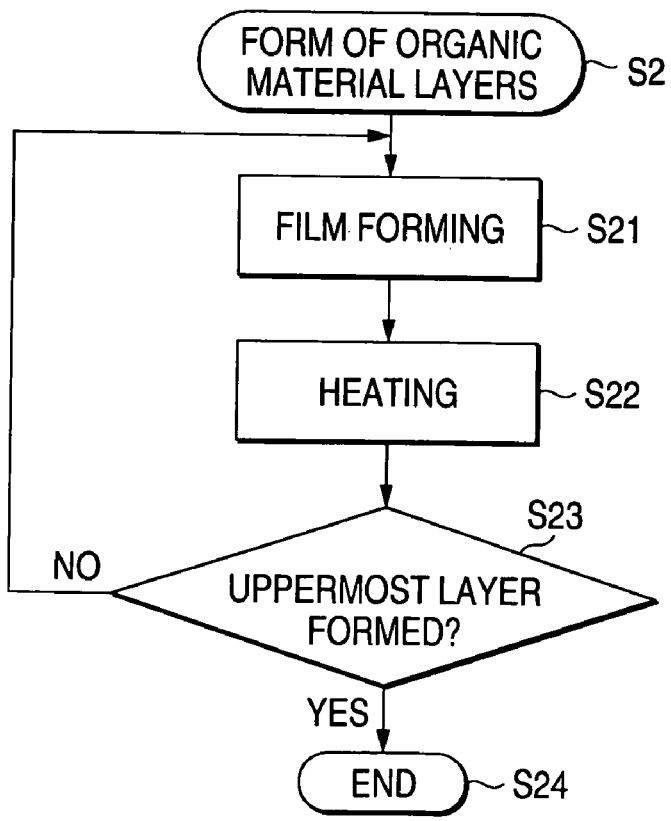

FIGS. 3A and 3B are views illustrating a production method of forming the organic EL element. FIG. 3A is a flowchart schematically showing the flow of the production method, and FIG. 3B is a flowchart showing the flow of steps of forming organic material layers in the method. In basic production steps, as shown in FIG. 3A, the first electrode 2 is formed on the substrate 1 (S1), the plural organic material layers 3 including at least one of the luminescent layers are stacked above the first electrode 2 (S2), and the second electrode 4 is formed above the organic material layers 3 (S3).

The production method has the following characteristic step. Namely, the method has a step (S22) in which, after steps (S21) of growing at least two organic material layers 3A, 3B having an interface which electrons or holes traverse, the organic material layers 3A, 3B are heat-treated at a temperature that is equal to or higher than the glass transition points of the materials respectively constituting the organic material layers 3A, 3B, and equal to or lower than the melting points of the materials. The case where all the organic material layers 3 in the above-described embodiment of the organic EL element are to be heat-treated will be described with reference to FIG. 3B. When the growing step (S21) of growing one organic material layer by one of various growing methods is ended, the control is transferred to the heating step (S22) of immediately applying a heating process on the layer. This is repeated on each of the organic material layers. When the uppermost organic material layer is processed, the organic material forming step (S2) is ended, and the control is transferred to the subsequent second-electrode forming step (S3). Alternatively, after a step (S21) of growing plural organic material layers is ended, the heating step (S22) may be applied to a bundle of plural ones of the organic material layers which have been grown in the growing step (S21).

The heating step (S22) may be conducted in the following manner. A heating unit is disposed in a film growth chamber in which the organic material layers are to be grown, and, after the film growth is ended, the heating process is conducted as needed. Alternatively, a heating chamber may be additionally disposed, a substrate 1 on which the organic material layers are grown may be moved from respective film growth chambers to the heating chamber, and the heating process may be then conducted in the heating chamber. As the heating unit, heater heating, IR irradiation, or the like may be employed. Although description is omitted, production methods respectively corresponding to the above-described embodiments of the organic EL element are conducted while employing a similar heating step.

EXAMPLES

Hereinafter, further specific examples will be described.

Example 1

First, as first electrodes which are arranged at predetermined intervals so as to be parallel to each other, a thin film of ITO is formed above a substrate of glass by vapor deposition or sputtering, and then patterned to a desired shape by photolithography.

Next, as a hole injecting layer, a layer of copper phthalocyannine (Cu-Pc) of a thickness of 45 nm is formed by vapor deposition. As a first hole transporting layer, a layer of PPD of a thickness of 40 nm is formed above the hole injecting layer by vapor deposition.

By a heating unit disposed in a film growth chamber in which the first hole transporting layer has been grown, a heating temperature of a range which is equal to or higher than the glass transition point Tg=130.C of PPD, specifically 130 to 180.C, and preferably 140 to 150.C is set, and the first hole transporting layer is heat-treated in the film growth chamber to be fused under reduced pressure or vacuum state. The heating time is about 5 minutes. As the heating unit, heater heating or a halide lamp is employed.

Next, as a second hole transporting layer, a layer of NPB of a thickness of 40 nm is formed by vapor deposition. Similarly, the second hole transporting layer is heat-treated to be fused, in a temperature range which is equal to or higher than the glass transition point Tg=98.C of NPB, specifically 100 to 130.C. At this time, the heating process is conducted at a temperature which is equal to or lower than Tg of the first hole transporting layer, and hence the first hole transporting layer is not melted.

Next, as an electron transporting and at least one of luminescent layers, a layer of $Alq_3$ of a thickness of 80 nm is formed by vapor deposition. Furthermore, as an electron injecting layer, a layer of $LiO_2$ is vapor-deposited at a thickness of 10 nm, and, as a second electrode, Al is stacked above the electron injecting layer.

Example 2

As first electrodes which are arranged at predetermined intervals so as to be parallel to each other, a thin film of ITO is formed above a substrate of glass by vapor deposition or sputtering, and then patterned to a desired shape by photolithography.

Next, as a hole injecting layer, a layer of 2-TNATA which is a starburst compound is formed by vapor deposition at a thickness of 45 nm. In a similar manner as the example described above, the hole injecting layer is heat-treated to be fused, in a temperature range which is equal to or higher than the glass transition point Tg=110.C of 2-TNATA, specifically 110 to 160.C, and preferably 115 to 135.C. As a hole transporting layer, a layer of NPB of a thickness of 40 nm is formed by vapor deposition above the hole injecting layer. In a similar manner as described above, the hole transporting layer is heat-treated to be fused, in a temperature range which is equal to or higher than the glass transition point Tg=98.C of NPB, specifically 100 to 110.C. At this time, the hole transporting layer is heated at a temperature which is equal to or lower than Tg of the hole injecting layer, and hence the hole injecting layer is not melted.

Next, in a similar manner as Example 1, at least one of luminescent layers, an electron injecting layer, and a cathode are sequentially stacked by the vapor deposition method. In this case, the ionization potential of 2-TNATA is Ip=5.1 eV and that of NPB is Ip=5.4 eV. In an organic EL element which is produced by the example, therefore, excellent durability can be attained.

Example 3

As first electrodes which are arranged at predetermined intervals so as to be parallel to each other, a thin film of ITO is formed above a substrate of glass by vapor deposition or sputtering, and then patterned to a desired shape by photolithography.

Next, as a hole transporting layer, a layer of PPD is formed by vapor deposition at a thickness of 40 nm. In a similar manner as described above, the hole transporting layer is heat-treated to be fused, in a temperature range which is equal to or higher than the glass transition point Tg=130.C of PPD, specifically 130 to 180.C, and preferably 140 to 150.C.

Next, as a luminescent layer, a layer of $Alq_3$ (Tg=175.C, Ip=6.1 eV) of a thickness of 50 nm is formed by vapor deposition. A layer of PyPySPyPy (Tg=90.C, Ip=6.1 eV) is formed as an electron transporting layer above the luminescent layer by vapor deposition. Thereafter, in a similar manner as described above, the electron transporting layer is heat-treated to be fused, in a temperature range which is equal to or higher than Tg of PyPySPyPy, specifically, 90 to 130.C, and preferably 100 to 120.C. At this time, since the electron transporting layer is heat-treated at a temperature which is lower than Tg of the materials of the hole transporting layer and the luminescent layer that are stacked below the electron transporting layer, the hole transporting layer and the luminescent layer do not melt. In a similar manner as Example 1, thereafter, an electron injecting layer and a cathode are stacked.

Example 4

As a first electrode, Al which is a material of a cathode is vapor-deposited above a substrate, and then patterned. As an electron transporting layer, a layer of $Alq_3$ of a thickness of 50 nm is formed above the first electrode by vapor deposition.

Next, as a luminescent layer, a layer of a distyrylarylene derivative (IDE120 (a product of Idemitsu Kosan Co., Ltd.), Tg=106.C) is formed at a thickness of 40 nm by vapor deposition. Thereafter, the luminescent layer is heat-treated to be fused, in a temperature range which is equal to or higher than Tg of IDE120, 120 to 170.C, preferably, 130 to 150.C.

Next, as a hole transporting layer, a layer of NPB (Tg=98.C) of a thickness of 40 nm is formed above the luminescent layer by vapor deposition. Thereafter, the hole transporting layer is heat-treated to be fused, in a temperature range which is equal to or higher than Tg of NPB, specifically, 100 to 130.C, preferably, 110 to 120.C. As a hole injecting layer, thereafter, a layer of m-MTDATA (Tg=75.C) of a thickness of 40 nm is formed by vapor deposition. Then, the hole injecting layer is heat-treated to be fused, in a temperature range which is equal to or higher than Tg of m-MTDATA, specifically, 75 to 105.C, preferably, 80 to 100.C. As an anode, ITO is formed by vapor deposition above the hole injecting layer.

According to the embodiment and experiments which have been described above, at least two of organic material layers forming an organic EL element are heat-treated at a temperature that is equal to or higher than glass transition points of materials respectively constituting the organic material layers, and equal to or lower than melting points of the materials, the at least two organic material layers having an interface which electrons or holes traverse. Therefore, local ungrown portions are not formed in the stacked layers, and a partial short circuit between electrodes, abnormal emission and dark spot formation due to occurrence of a leakage current, and the like can be prevented from occurring. Furthermore, excellent traversing of charges through an interface between the stacked organic material layers is enabled, and satisfactory luminance characteristics of the organic EL element are ensured. Moreover, sufficient thermal stability and a prolonged life period can be attained.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An organic EL element, comprising:
    a substrate;
    a first electrode formed above the substrate;
    a plurality of organic material layers including at least one of luminescent layers stacked above the first electrode; and
    a second electrode formed above the organic material layers,
    wherein at least two of the organic material layers are fused by heat treating at a temperature that is equal to or higher than glass transition points of materials respectively constituting the organic material layers, and equal to or lower than melting points of the materials, the at least two organic material layers having an interface which electrons or holes traverse.

2. The organic EL element according to claim 1, wherein a glass transition point of a material constituting an arbitrary one of the organic material layers is lower than a glass transition point of a material constituting an organic material layer which is above a side of the substrate with respect to the arbitrary one organic material layer.

3. The organic EL element according to claim 1, wherein the organic material layers are stacked above the substrate in an order of descending glass transition points of materials respectively constituting the organic material layers.

4. The organic EL element according to claim 1, wherein each of at least two of the organic material layers is heat-treated at a temperature that is equal to or higher than a glass transition point of a material constituting the organic material layer, and equal to or lower than a melting point of the material, the at least two organic material layers being adjacently stacked.

* * * * *